(12) United States Patent
Conti et al.

(10) Patent No.: US 12,243,794 B2
(45) Date of Patent: Mar. 4, 2025

(54) SYSTEM IN A PACKAGE MODIFICATIONS

(71) Applicant: Octavo Systems LLC, Sugar Land, TX (US)

(72) Inventors: Michael Kenneth Conti, Dallas, TX (US); Christopher Lloyd Reinert, Frisco, TX (US); Masood Murtuza, Sugar Land, TX (US)

(73) Assignee: OCTAVO SYSTEMS LLC, Sugar Land, TX (US)

( * ) Notice: Subject to any disclaimer, the term of this patent is extended or adjusted under 35 U.S.C. 154(b) by 0 days.

(21) Appl. No.: 18/518,852

(22) Filed: Nov. 24, 2023

(65) Prior Publication Data

US 2024/0087975 A1 Mar. 14, 2024

Related U.S. Application Data

(62) Division of application No. 17/091,371, filed on Nov. 6, 2020, now Pat. No. 11,869,823.

(60) Provisional application No. 62/932,976, filed on Nov. 8, 2019.

(51) Int. Cl.
| | |
|---|---|
| *H01L 23/495* | (2006.01) |
| *H01L 21/48* | (2006.01) |
| *H01L 21/56* | (2006.01) |
| *H01L 23/00* | (2006.01) |
| *H01L 23/31* | (2006.01) |
| *H01L 23/32* | (2006.01) |
| *H01L 23/498* | (2006.01) |

(52) U.S. Cl.
CPC .......... *H01L 23/32* (2013.01); *H01L 21/4853* (2013.01); *H01L 21/565* (2013.01); *H01L 23/3128* (2013.01); *H01L 23/49816* (2013.01); *H01L 23/49838* (2013.01); *H01L 24/16* (2013.01); *H01L 24/48* (2013.01); *H01L 2224/16227* (2013.01); *H01L 2224/48227* (2013.01)

(58) Field of Classification Search
CPC ............................ H01L 21/4853; H01L 21/56
USPC ......................................................... 257/723
See application file for complete search history.

(56) References Cited

U.S. PATENT DOCUMENTS

| | | | |
|---|---|---|---|
| 5,273,938 A | 12/1993 | Lin et al. | |
| 6,388,333 B1 | 5/2002 | Taniguchi et al. | |
| 6,566,745 B1 | 5/2003 | Beyne et al. | |
| 7,176,579 B2* | 2/2007 | Konishi | H01L 25/0657 257/E23.125 |
| 7,709,946 B2* | 5/2010 | Ryu | H01L 25/18 257/E23.012 |
| 8,130,512 B2 | 3/2012 | Yoon et al. | |
| 9,888,577 B2* | 2/2018 | Meyer | H05K 1/165 |
| 11,139,251 B2* | 10/2021 | Oh | H01L 21/561 |
| 2001/0011766 A1* | 8/2001 | Nishizawa | G06K 19/07 257/784 |
| 2005/0148160 A1* | 7/2005 | Farnworth | H01L 24/16 257/E29.022 |
| 2010/0123233 A1 | 5/2010 | Yoon et al. | |
| 2012/0188738 A1* | 7/2012 | Warren | H05K 3/284 29/832 |
| 2014/0091455 A1 | 4/2014 | Strothmann et al. | |

(Continued)

*Primary Examiner* — Nitin Parekh
(74) *Attorney, Agent, or Firm* — ROTHWELL, FIGG, ERNST & MANBECK, P.C.

(57) ABSTRACT

Methods and structures for manufacturing one or more System in a Package (SiP) devices, where the functionality of a packaged SiP device may be modified by additional components.

19 Claims, 14 Drawing Sheets

(56) References Cited

U.S. PATENT DOCUMENTS

| | | |
|---|---|---|
| 2015/0325529 A1 | 11/2015 | Choi |
| 2015/0332938 A1 | 11/2015 | Palm et al. |
| 2018/0134546 A1 | 5/2018 | Oh et al. |
| 2018/0204741 A1* | 7/2018 | Chew ...................... H01L 24/24 |

* cited by examiner

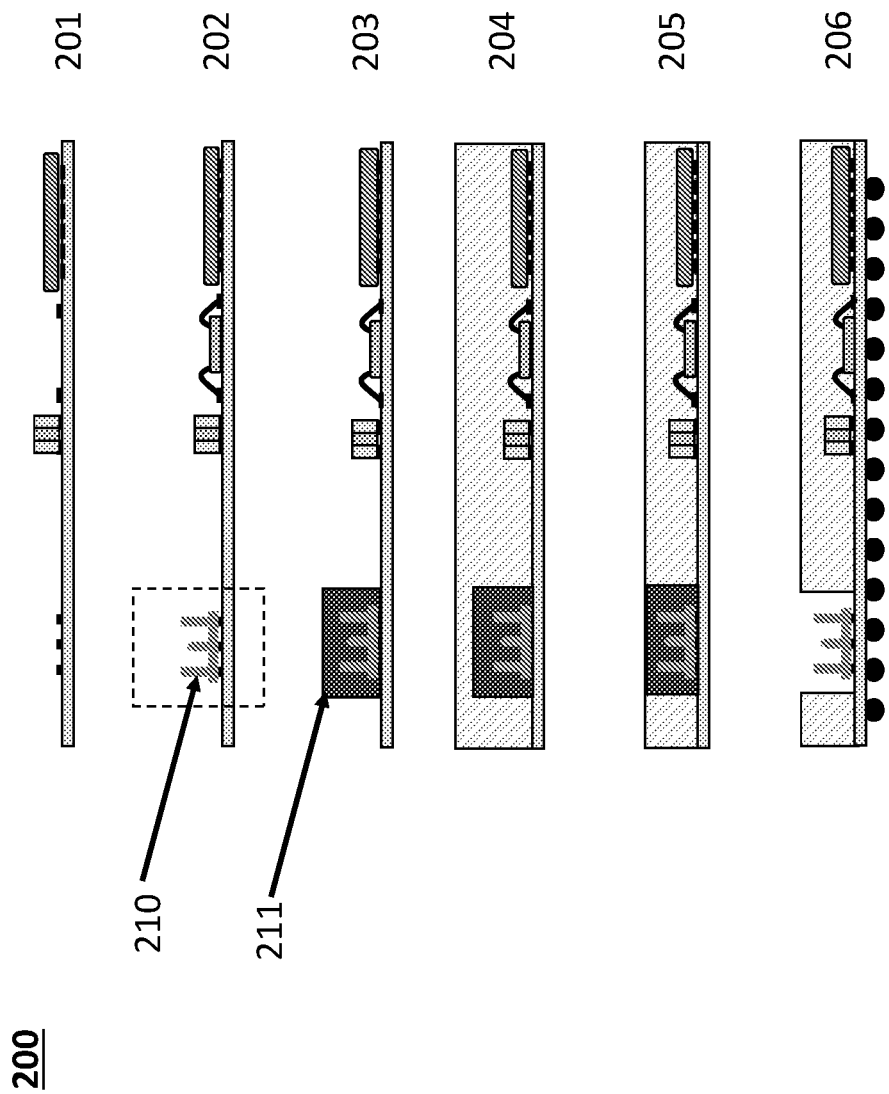

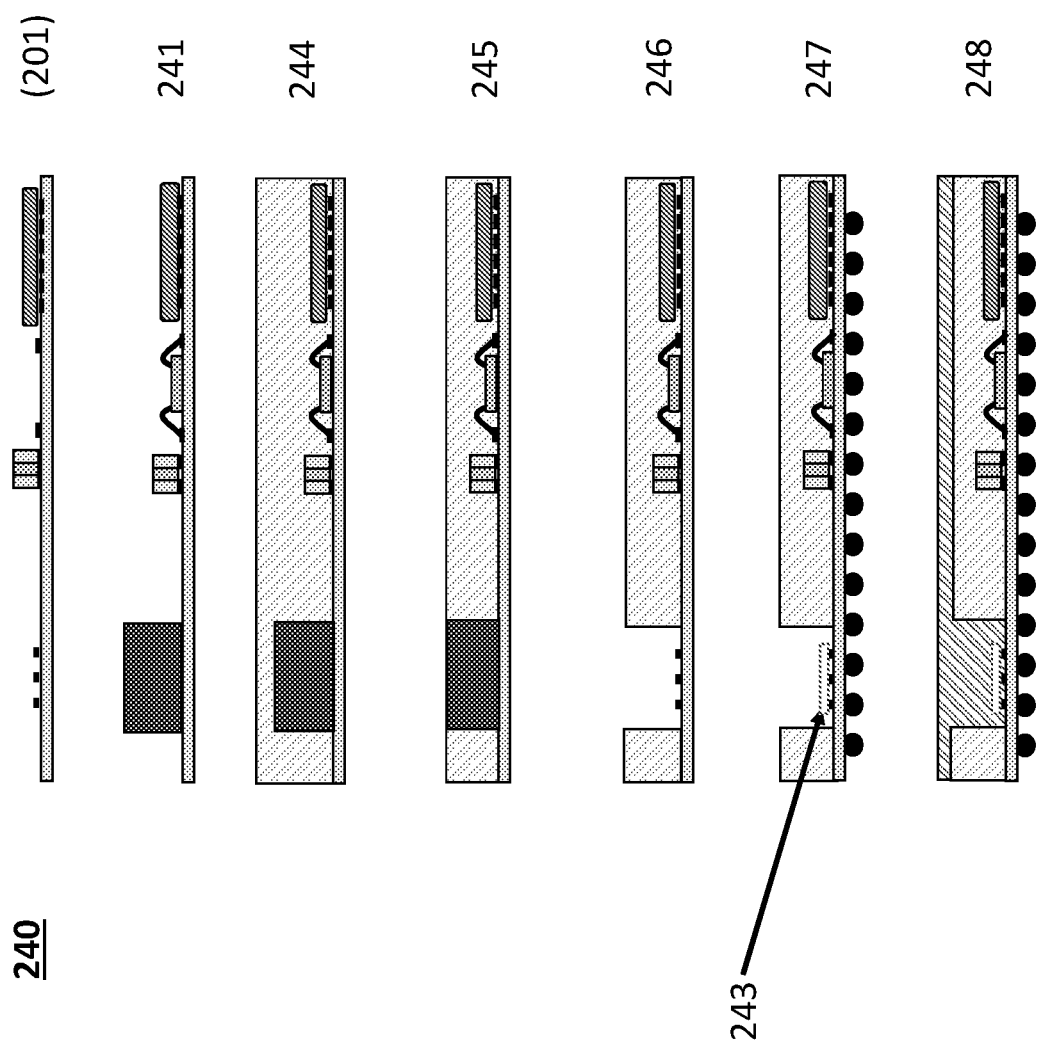

SYSTEM IN A PACKAGE MODIFICATIONS

CROSS REFERENCE TO RELATED APPLICATION(S)

This application is a divisional of U.S. application Ser. No. 17/091,371 filed on Nov. 6, 2020, which claims priority to U.S. provisional application No. 62/932,976, filed on Nov. 8, 2019. The above identified applications are incorporated by reference.

TECHNICAL FIELD

Aspects of this disclosure relate to structures and methods for modifying or adding to the functionality of a partially packaged System in a Package (SiP) device.

BACKGROUND

System-on-a-Chip ("SoC") refers to a device currently used in the semiconductor industry that incorporates different functional circuit blocks on a single monolithic block of silicon to form one system circuit. Systems in a Package ("SiP"s) are currently used in the semiconductor industry to assemble multiple integrated circuits, other devices, and passive components in one package.

SUMMARY

According to embodiments, a SiP device is provided that comprises: a substrate comprising a plurality of connectors on the top surface of the substrate, and having a plurality of layers with conductive paths, a plurality of vias associated therewith for making interconnections among the plurality of connectors, and one or more conductive pads that are located in one or more areas on the top surface of the substrate for additional interconnections to one or more of the plurality of connectors; and a plurality of components mounted on the plurality of connectors on the top surface of the substrate and operatively interconnected using the vias and conductive paths, where the plurality of components and connectors are encapsulated during the packaging of the SiP device, and the conductive pads are located in one or more areas on the top surface of the substrate that are not encapsulated. The device may further comprise at least one additional device or component that is mounted on the one or more conductive pads. In some embodiments, the additional device or component is a SiP comprising a second SiP substrate, for instance, having a ball grid array for interconnecting with the device substrate. In some embodiments, at least one additional device or component is operatively interconnected with the plurality of components and is configured to modify the functionality of the SiP device. In some embodiments, the SiP device may have a ball grid array on a bottom surface with component connectors on a top surface.

According to embodiments, a SiP is provided that comprises: a substrate comprising a plurality of layers with etched conductive paths, a plurality of vias associated therewith for making component interconnections, and one or more connectors in a preselected area on a top surface of the substrate for mounting at least one additional device or component and for making additional interconnections for the at least one additional device or component; a plurality of components mounted on the substrate and operatively interconnected using the vias and conductive paths; and a first encapsulant that covers and protects the plurality of components mounted on the substrate, where the preselected area of the substrate is not encapsulated by the first encapsulant and is configured for receiving and operatively connecting at least one additional device or component and for making a plurality of connections to the substrate using one or more connectors on the preselected area of the top surface of the substrate. In some embodiments, an additional device or component mounted in the preselected area using one or more of the connectors. The additional device or component may be fully covered by a different, second encapsulant.

These and other features of the disclosure will become apparent to those skilled in the art from the following detailed description of the disclosure, taken together with the accompanying drawings.

BRIEF DESCRIPTION OF THE DRAWINGS

FIGS. 2A, 2B, and 2C depict processes for manufacturing a device according to embodiments.

DETAILED DESCRIPTION

Figure 1:
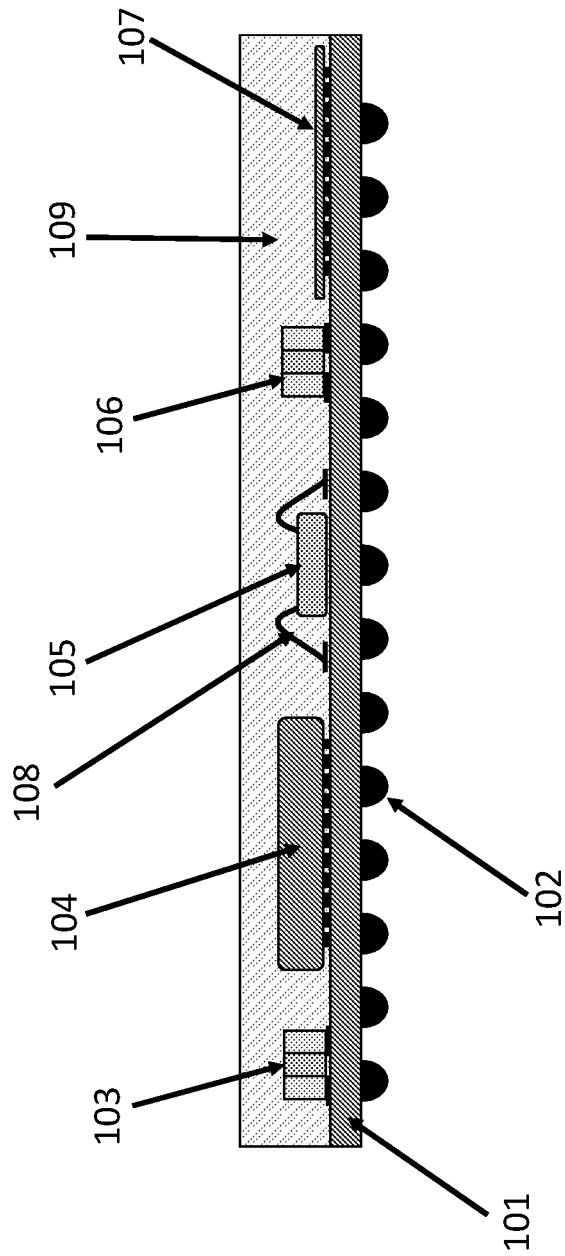
FIG. 1 depicts an example of a SiP technology.

SiPs can enable integration of devices with diverse fabrication technologies such as digital, analog, memories, and other devices and components such as discrete circuits, devices, sensors, power management, and even other SiPs that are otherwise impossible or impractical to integrate in a single silicon circuit like an application-specific integrated circuit (ASIC) or SoC. These other discrete circuits may include non-silicon based circuits, such as organic, germanium, or Gallium Nitride (GaN) based circuits, as examples. SiPs are also attractive because SiPs can allow for miniaturization of microelectronic systems from a printed circuit board tens of square cm in size, to a single package often a few square cm or less. Another potential benefit of a SiP is that it can allow for building prototypes in order to test a system prior to further integration of some or all of components into a single monolithic silicon circuit.

SiP solutions combine multiple functional components and devices in a single package. Such SiPs may be either entirely customized for a specific function or purpose, or they may be general-purpose building blocks around which specific components may be added for a specific application. With general-purpose building block SiPs, they are often desirable because of the potential use in many applications with additional specific components added for each unique application. However, there may be drawbacks in both types of SiPs. For the case of custom SiPs, they are usually single-purpose products that require extensive redesign if there is a change to be made. A potential disadvantage of a general purpose SiP is that it grows the component count, and some of the space and costs savings of using a single purpose or custom SIP are lost. However, aspects of the present disclosure can overcome certain of these disadvantages.

For instance, and according to embodiments, a multi-step process allows portions of the SiP to be assembled as a standard sub-system of the final product. Other portions of the SiP substrate may be reserved for various additional components to be added at a later time and/or in a different physical business location such as, for example, but not limited to, a different assembly location, at an end customer's location, or a different city, state, or nation. The combination of the additional components with a general purpose SiP may be used to create a custom solution for a specific purpose. The final SiP may have different, or improved, functionality from the original functionality of the initial sub system. This may result, for instance, from the interconnection between the additional components and the original functional elements of the SiP.

According to embodiments, a SiP is provided that is customizable by a customer that, for example, only needs a small number of SiPs. The customer can acquire the SiPs with a standard sub-system already integrated into it. Once acquired, the customer can add special components unique to their product offering in the configuration area to create the exact product needed. The customer may do this for many reasons such as, but not limited to, unique applications, low volume applications, security or encryption and decryption circuits.

Aspects of the present disclosure allow customization of a packaged SiP without paying the penalty of additional price and design activity associated with fully custom SiPs. These secondary packaged components or devices may be designed by a user, and open up the use of general-purpose type SiP designs to limitless customization possibilities.

The terms "functional module" or "functional components" can be used to refer to one of a family of interchangeable substrates populated with components, or components or devices, for use in altering the function of a general purpose SiP device when electrically connected to a set of connectors associated with a general purpose SiP's base substrate.

According to embodiments, a general purpose SiP may be a customized SiP for a family of products with specific functionality. By way of example, the base SiP device may be altered to change its original functionality dependent on which packaged or unpackaged functional module from a family of modules is connected to a SiP's primary or base substrate. In the context of the current disclosure, an interposer may be used as another substrate in a SiP. The interior substrate may be the base substrate for the SiP or an interposer operatively connected inside the SiP. In some embodiments, a plurality of conductors may be arranged in a pattern on a bottom surface of the functional module for connecting to and mounting on a base substrate in a SiP. However the substrate on which the functional module or functional components is mounted may be the base substrate for the SiP, or an interposer inside the SiP.

Referring now to FIG. 1, an example of System in Package (SiP) technology (also known as System on Module, Multi-chip Module, etc.) is illustrated. In this example, a system 100 can be created by integrating multiple components, both active (104, 105, 107) and passive (103, 106) onto a substrate 101. Once assembled, external connectors 102 are attached and the components encapsulated 109 to form a packaged semiconductor component. In the example of FIG. 1, the active components include a packaged device 104, a semiconductor die 105 wire bonded 108 to the substrate, and a die using flip chip technology 107 to attach directly to the substrate. The passive components 103 and 106 may be capacitors, resistors, or inductors, for instance. Other components, not shown, may include, but are not limited to, diodes, transistors, optical devices, mechanical devices, and crystals. In this depiction, the external connectors 102 are conductive balls arrayed in a matrix, known as a ball grid array (BGA). These external connectors 102 may have leads or be leadless (not shown in this example).

Figure 2B:
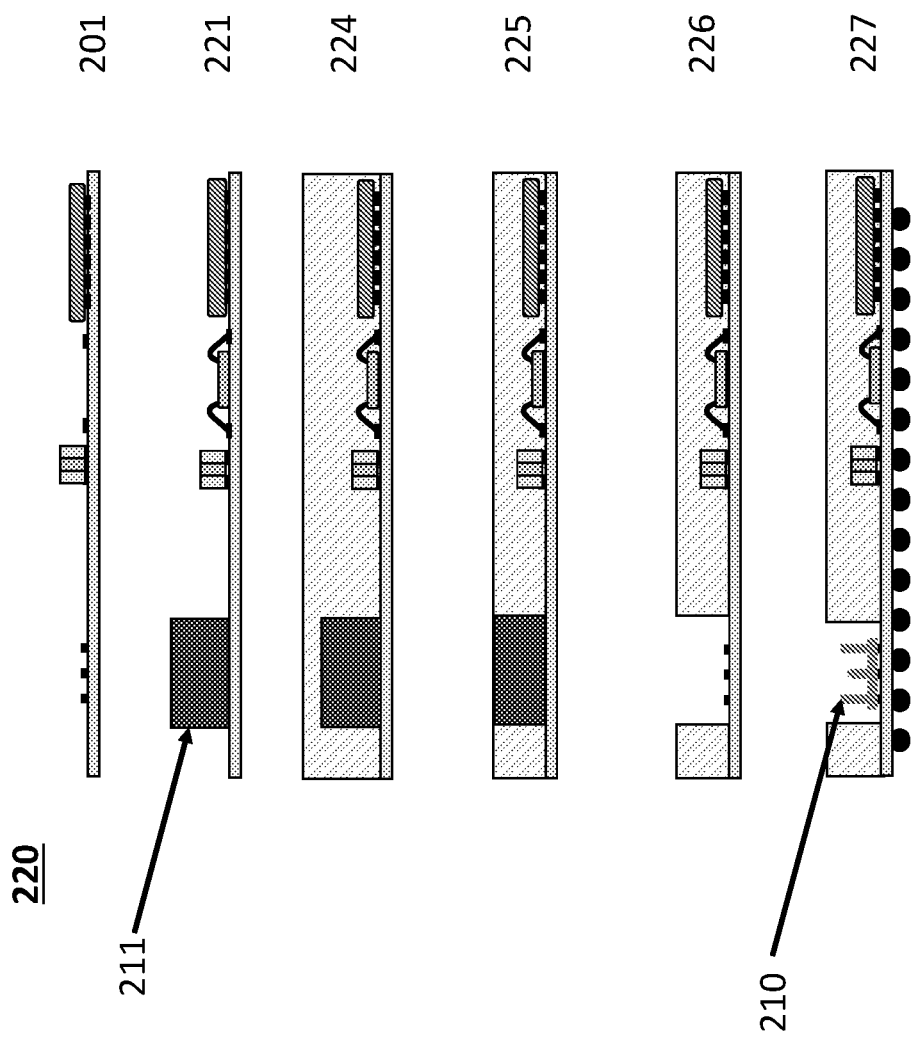

Referring now to FIGS. 2A, 2B and 2C, methods are illustrated according to some embodiments.

FIG. 2A depicts a manufacturing process 200 according to some embodiments. The process 200 may be used, for example, to attach a radio frequency (RF) connector 210 to a substrate of a base system in package (SiP) device. Although connector 210 is depicted as an RF connector in this example, other types of connectors or antennas can be used. For instance, connector 210 may be an optical connector for interfacing with one or more elements packaged within the SiP. Similarly, other types of devices may be used as element 210, including SiPs.

The process 200 may begin by attaching 201 surface mounted devices (SMDs), such as devices 103, 104, 106, onto the substrate. In step 202, an integrated circuit in die form 105 is attached, and it connects to the substrate using bond wires 108. Additionally, the RF connector 210 (or other component) is attached in step 202. Next, a plug 211 is applied over the RF connector 210 in step 203. This plug 211 will prevent encapsulant from filling the space occupied by the plug. The plug 211 may be, for example, a removable filler or a cap like cover. Other plugs may be used. Next, the substrate is encapsulated in step 204. In this depiction, the encapsulant covers the whole surface including the plug 211. Once encapsulated, a portion of the encapsulant over the plug 211 is removed at step 205 (e.g., shaved or ground off) to expose the plug 211. According to embodiments, the entire substrate is encapsulated (204), followed by the entire upper surface being shaved or ground (205), not just the region of the plug. In step 206, the plug is removed. This may be performed at a later time and/or location. The plug removal exposes the RF connector (or other device mounted in that location). Following satisfactory testing, for instance, the SiP is available for use. Examples of testing may include, for example, testing of an RF or optical component within the partially encapsulated base SiP where the connector 210 will be used as an antenna or other connection. Other examples of testing may include, for example, confirming that the partially encapsulated components are correctly configured using a USB or Ethernet connection 210.

FIG. 2B depicts another manufacturing process 220 according to some embodiments. As with process 200, process 220 may be used, for example, to attach an RF connector 210 to a substrate of a base SiP device. Although connector 210 is depicted as an RF connector in this example, other types of connectors or antennas can be used. In process 220, the plug is used to preserve an opening in the encapsulant for subsequent attachment of the connector (or other component, such as a circuit). In some embodiments, the additional component may be one or more of additional memory devices, wireless or wire-lined communications circuitry, security circuitry, Field Programmable Gate Arrays (FPGAs), Field Programmable Analog Arrays (FPAAs), sensors, video and analog interface devices.

According to embodiments, the process 220 begins with step 201 by attaching surface mounted devices 103, 104, 106 (SMDs) onto the substrate. The next step 221 attaches a plug 211 to the area designated for the RF connector (or other component) to keep mold compound out of that area. That is, a plug 211 may be applied before mounting of the additional component (e.g., component 210), or at any time during the assembly process prior to encapsulation. In step 221, the die 105 may also be mounted and connected to the substrate using bond wires (e.g., 108). While depicted as a single step, the application of the plug and mounting of components need not be performed in a single processing step. According to embodiments, the plug will prevent any encapsulant from filling the space designated for the RF connector. The entire substrate is then encapsulated at step 224. In this example, the encapsulant covers the whole surface including the plug. Once encapsulated, the encapsulant is partially removed 225 (e.g., shaved or ground off) in the area over the plug to expose the plug 211. In step 226, which may be optional, the plug is removed to expose the (surface mount) SMT space on the SiP substrate for RF connector 210, and the RF connector can subsequently be installed on the substrate. In step 227, the RF connector is shown as installed. Following satisfactory testing, the SiP with the installed RF connector is available for use. Alternatively, a device as shown at step 224 or 225 may be shipped to a customer, using the plug 211 to seal and protect the mounting area.

FIG. 2C depicts a manufacturing process 240 according to embodiments, which can be used to attach a separate component (e.g. a functional module or functional components) 243, after a primary SIP assembly has been completed.

The process 240 may begin (like step 201) by attaching surface mounted devices 103, 104, 106 (SMDs) onto the substrate. The next step 241 comprises attaching a plug to keep mold compound out of the area designated for a secondary component (e.g. a functional module or functional components). This plug (e.g., plug 211) will prevent the encapsulant from filling the space designated for the secondary component (e.g. a functional module or functional components). In step 244 of this example, the encapsulant covers the whole surface including the plug. Once encapsulated, in step 245 the encapsulant is partially removed (e.g., shaved or ground off) in the area over the plug to expose the plug. In step 246, the plug is removed to expose the SMT space for the secondary component (e.g. a functional module or functional components). In step 247, the secondary component 243 is shown as installed. In step 248, the whole assembly may then be re-encapsulated, as illustrated. That is, according to embodiments, the process 240 may comprise two encapsulation steps.

According to embodiments, the plug may be, for example, but not limited to, a printed three-dimensional plug that may be hollow or solid, or any other type of three-dimensional plug. The plug may be constructed of any suitable material that will withstand molten encapsulant, and may be suitably attached to the substrate, such as for example, but not limited to solder and a solder mask outlining the area to be protected from the encapsulant. Further, the profile for the plug may be in any geometrical shape, such as triangular, circular, square, rectangular, etc.

As the time or place of steps 245, 246, 247, or 248 may be delayed or relocated to another assembly facility in another building, city, state or country according to embodiments, a SiP may be stored or transported in any of the conditions shown. For example, it could be stored or shipped after the initial encapsulation 244, after the removal of the package surface, either before (245) or after (246) the removal of the plug. It could also be stored or shipped after the circuit(s) 243 have been added, either prior to 247 or after the second encapsulation of the SiP 248.

According to embodiments, a packaged SIP is provided that comprising a substrate comprising a plurality of layers with etched conductive paths, a plurality of vias associated therewith for making component interconnections, and one or more connectors in a preselected area on a top surface of the substrate for mounting at least one additional device or component and for making additional interconnections for the at least one additional device or component; a plurality of components are mounted on the substrate and operatively interconnected using the vias and conductive paths; and encapsulant covers and protects the plurality of components are mounted on the substrate; and wherein the preselected area of the substrate is not encapsulated and is configured for operatively connecting at least one additional device or component and for making a plurality of connections to the substrate using the one or more connectors on the preselected area of the top surface of the substrate. There may be more than one such preselected area on the top surface of the substrate.

FIGS. 3A, 3B, 3C, 3D and 3E depict examples of SiPs. Such SiPs may result from the methods of FIGS. 2A-2C (200, 220, 240).

Figure 3A:
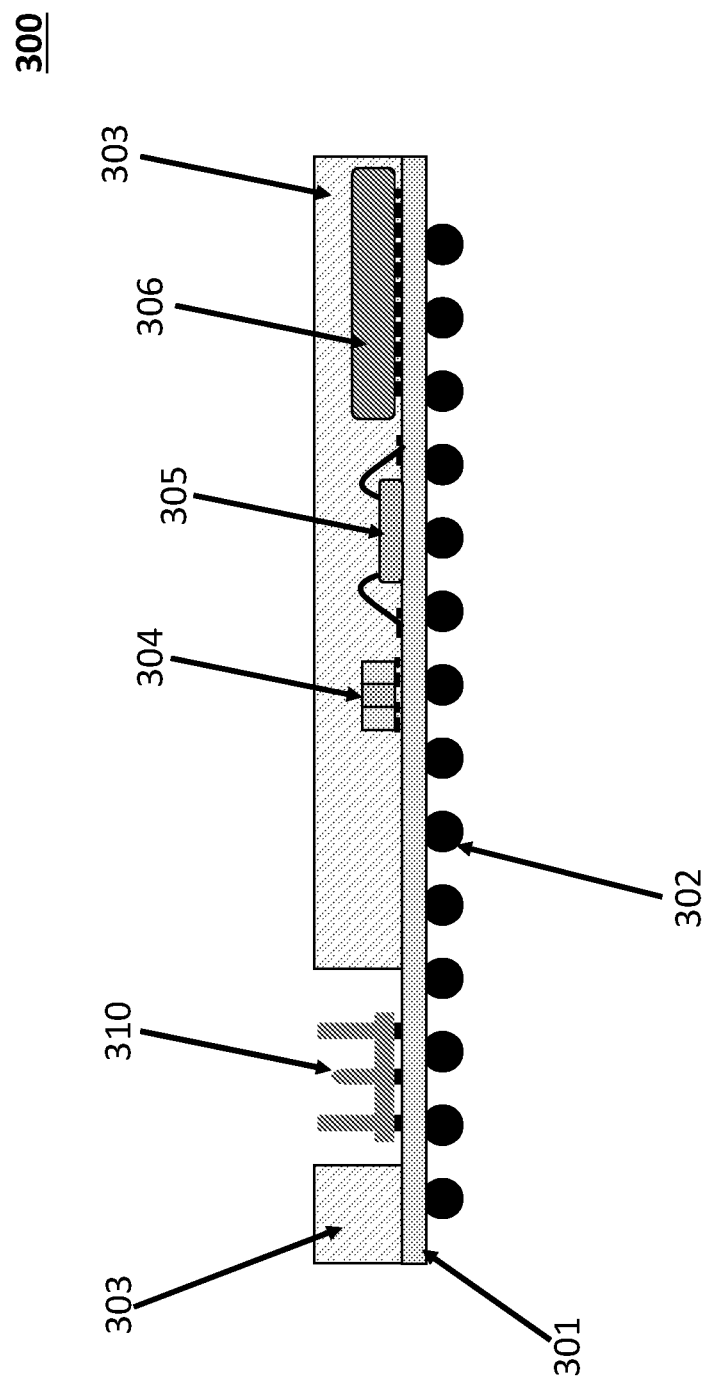
FIGS. 3A, 3B, 3C, 3D, and 3E depict SiP hardware configurations according to embodiments.

Referring now to FIG. 3A, a SiP 300 is illustrated according to embodiments that has an RF connector 310 (or other connector or device) attached to the SiP substrate and exposed so that the mating connecter (not shown) may be connected to it. Other components 304, 305, 306 on the substrate 301 are encapsulated 303 to protect them. External connectors 302 are attached to the substrate 301 to complete the SiP. Although connector 310 is depicted as an RF connector in this and other examples, other types of connectors or antennas can be used. For instance, connector 310 may be an optical connector for interfacing with one or more elements packaged within the SiP. Similarly, other types of devices may be used as element 310, including SiPs. According to embodiments, SiP 300 may correspond to one or more of processing steps and devices 206 and 227.

Figure 3B:
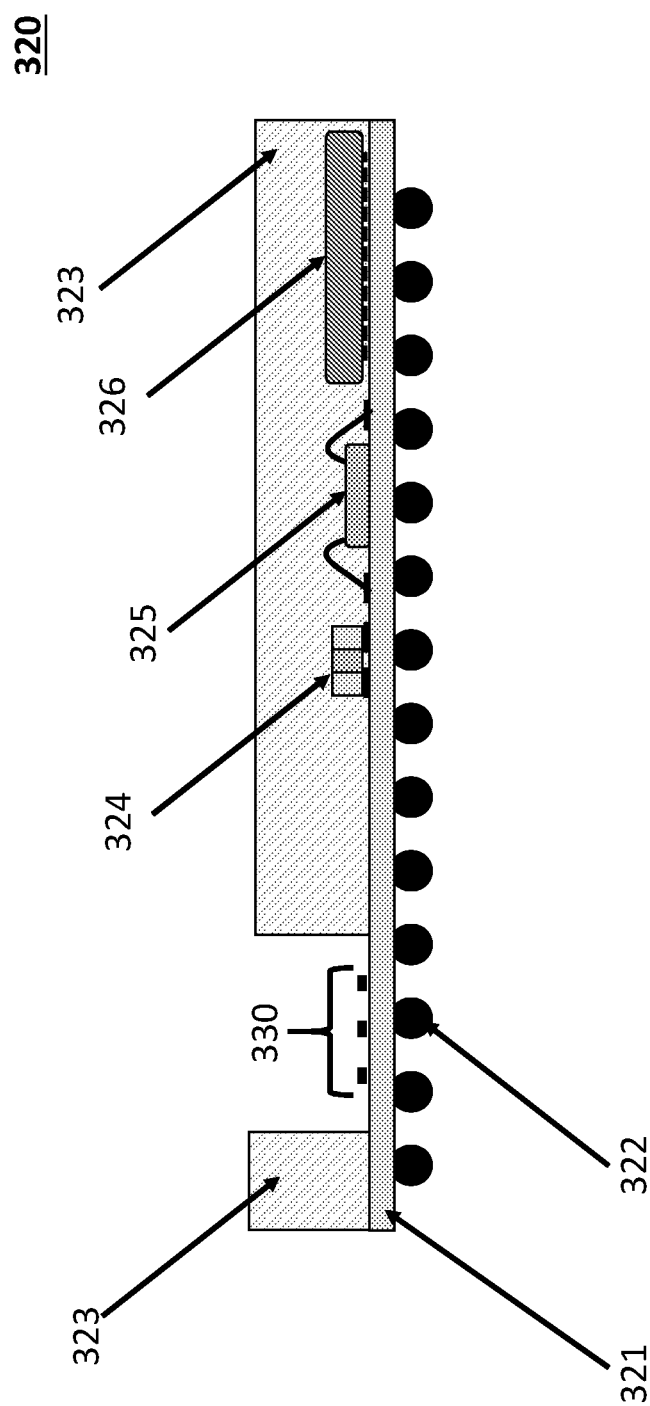

FIG. 3B depicts an alternative version 320 according to embodiments, which may correspond to processing step and device 246. In this SiP configuration 320, a portion of the substrate 321 is exposed with various substrate surface connectors 330 ready for secondary components to be attached. The other components on the substrate (324, 325, 326) are encapsulated 323 to protect them. Finally, external connectors 322 are provided on the substrate 321.

Figure 3C:
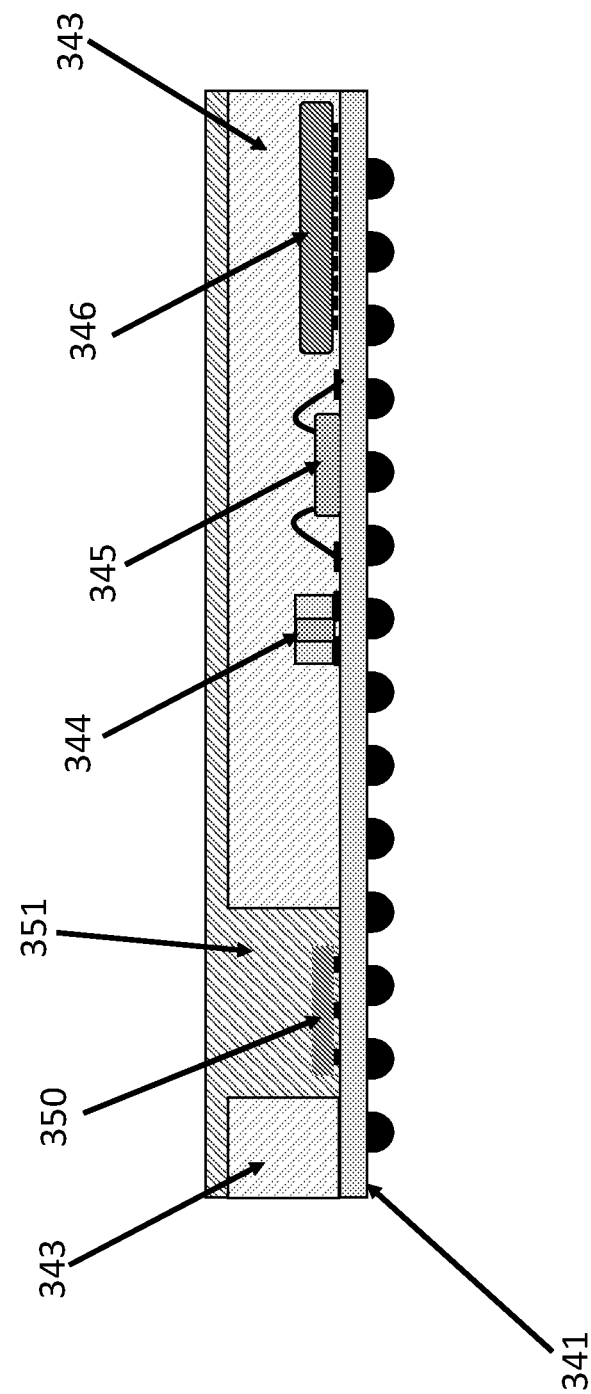

Referring now to FIG. 3C, a fully packaged SiP 340 is illustrated. In this example, a component 350 is attached to an exposed area of the substrate 341. Once the component 350 is attached, the SiP may be encapsulated a second time with encapsulant 351 to protect the new component(s) 350, in addition to the already encapsulated components 344, 345, 346, which are covered by the first encapsulant 343. In some embodiments, rather than a second full encapsulation 351, the non-encapsulated area may be filled with other protective materials.

Figure 3D:
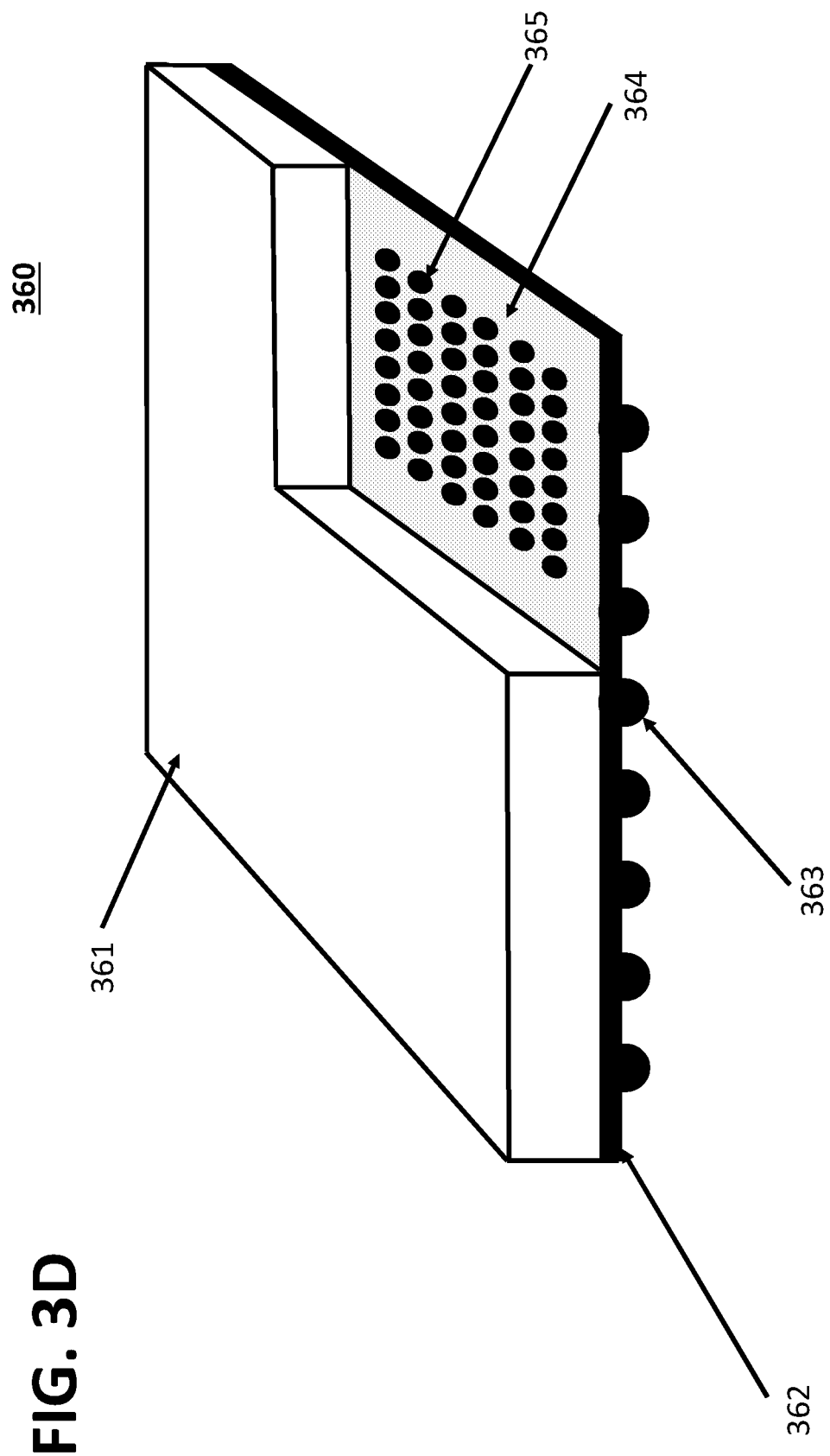

FIG. 3D illustrates a sectional view of the partial encapsulation 361 of a SiP 360, with a portion 364 of the substrate 362 exposed. This portion 364 may have a predetermined set of conductive pads 365 on which additional components may be added to modify the functionality of the SiP 360. For instance, a device mounted in region 364 may modify or otherwise augment the functionality of a set of components within encapsulant 261. Once the additional components have been added, the SiP may be encapsulated a second time, covered with an appropriate material, or left exposed. This may be, for instance, as illustrated with respect to encapsulant 351 of FIG. 3C.

Figure 3E:
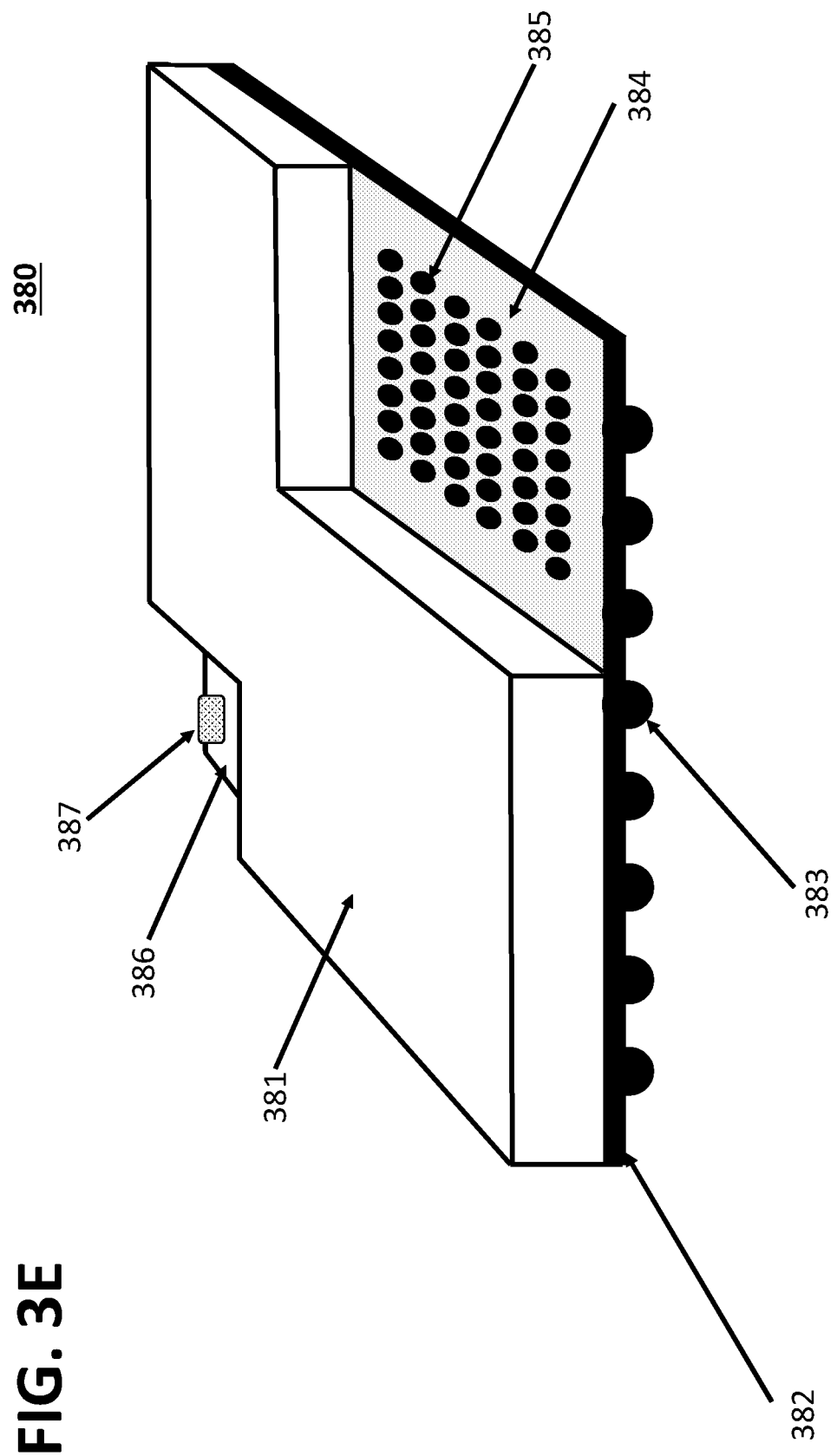

FIG. 3E illustrates a sectional view of the partial encapsulation 381 of a SiP 380, with two exposed portions 384 and 386 of the substrate 382. Although two such areas are depicted in this example, multiple such portions may be crated according to embodiments. The two portions of exposed substrate 384 and 386 may have a predetermined set of conductive pads 385 on which additional components 387 may be added to modify or otherwise augment the functionality of the SiP 380, or on which an external connector (e.g., an optical connection) may be added. Once the components (e.g., 387) have been added, either, or both may be encapsulated as illustrated with respect to FIG. 3C, for example, or they may be otherwise covered with an appropriate material, or left exposed, any one of which may be determined by the end use of the SiP. According to embodiments, the exposed portions of the substrate may be on any or all of the four corners or four sides of the substrate. In certain aspects, non-square substrates, devices, and exposed portions may be used.

FIGS. 4A, 4B, 4C and 4D depict methods for developing SiPs according to embodiments. The methods can provide, for instance, SiP substrates that have a permanent portion and at least one configurable portion. FIG. 2 may indicate one or more steps related to these methods.

Figure 4A:
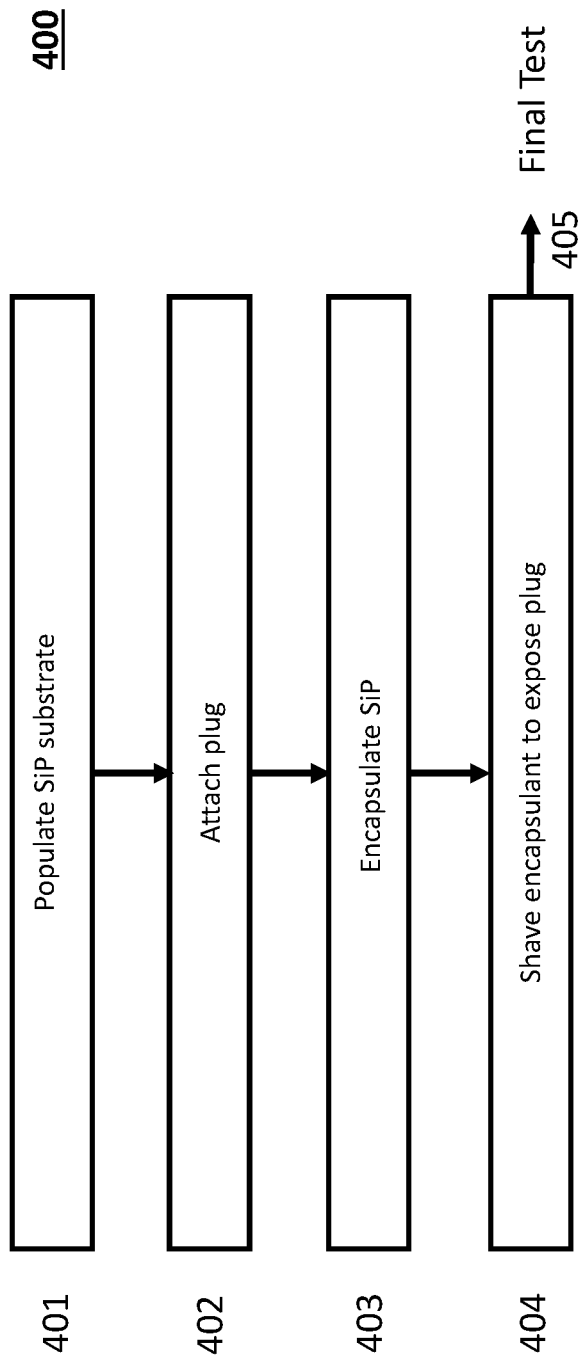
FIGS. 4A, 4B, 4C, and 4D depict manufacturing and testing processes according to embodiments.

FIG. 4A shows a method 400 of the first step of a process according to embodiments. FIG. 4A may be, for instance, a method for creating SiP ready customization. It begins by populating 401 the SiP substrate with the permanent set of components. Once the permanent set of components are attached, a plug is attached 402 to the substrate on the areas that will be left un-encapsulated (or bare) after the encapsulant has been added 403. After the encapsulant has been added, the top surface of the encapsulant is removed 404 such that the plug is exposed. Finally, after acceptable testing 405, the encapsulated SiP is put in inventory ready for the addition of the configurable portion of the components.

Figure 4B:
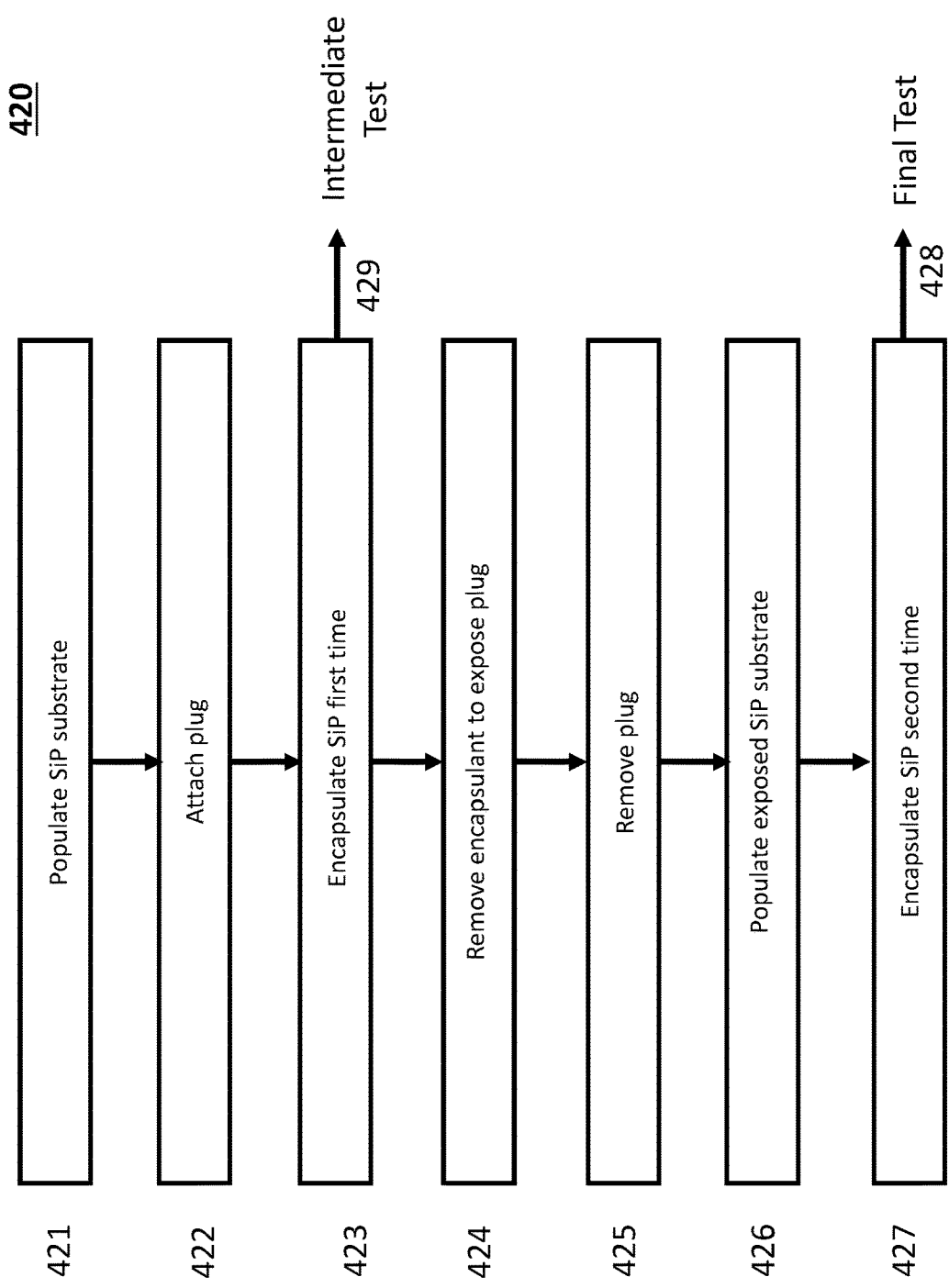

FIG. 4B shows a method 420 for manufacturing a complete SiP product. According to embodiments, it begins with populating 421 the SiP substrate with the permanent set of components. A second step may comprise attaching 422 the plug to the substrate. According to embodiments, the plug may be attached at any time during the assembly process prior to encapsulation. Next, the first encapsulation 423 is performed. At this time, an intermediate production test 429 may be performed to determine if the SiP is ready for the next assembly step. A next step may be removing part of the encapsulant 424 to expose the plug. In some embodiments, this step may be delayed until the appropriate time for the configurable components to be attached. This may provide, for instance, protection for the mounting surfaces until such time. Once the top surface of the encapsulant over the plug is removed and the plug exposed, the plug is removed at step 425. With the plug removed, a configurable set of components may be attached 426 to the SiP substrate (e.g., a functional module or other component may be attached). In some embodiments, individual components may be attached to adjust the SiP configuration. In some embodiments, a set of components on a substrate may be attached via the other substrate to adjust the SiP configuration. For instance, the functional module may itself be a SiP. A second encapsulation 427 of the SiP may then be performed to cover the whole SiP. According to embodiments, materials other than encapsulant may be used to protect the installed configurable set of components. Finally the completed SiP is tested 428. Following satisfactory testing, the SiP is available for use.

Figure 4C:
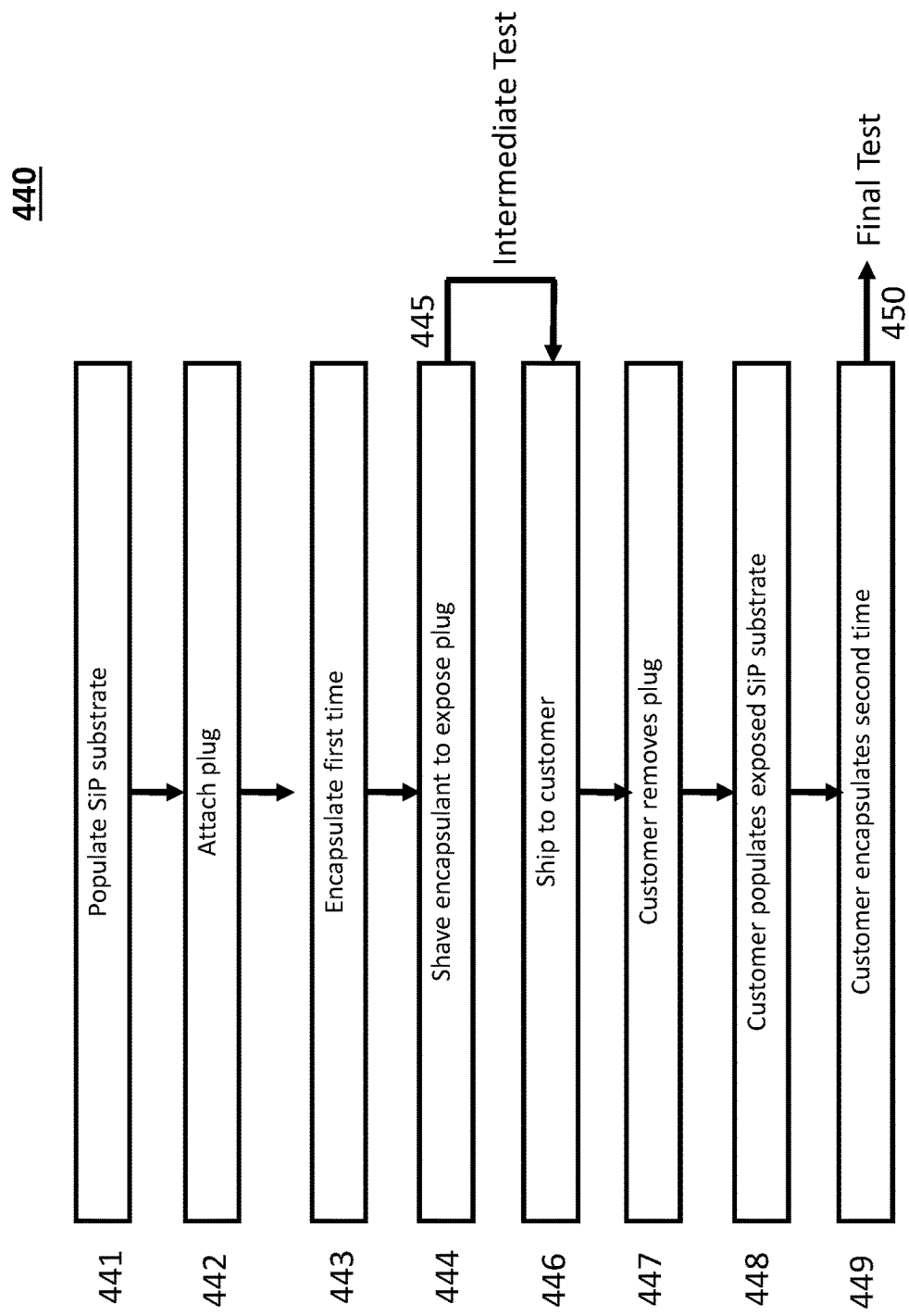

FIG. 4C shows a method 440 that comprises multiple parts. FIG. 4C may be, for instance, a method for creating end product at a vendor and/or customer. According to embodiments, a SiP may be created in an assembly house in the first set of steps, for example, according to steps 441-445. These steps may comprise populating the SiP substrate, attaching the plug, applying a first encapsulant, and shaving the encapsulant to expose the plug. According to embodiments, the SiP is then shipped 446 to a customer or its assembly site. Additionally, steps of removing the plug 447, populating 448 the exposed substrate with the configurable components, and encapsulating 449 the whole SiP may then be performed. According to embodiments, the method 440 may conclude with performing a production test 450. According to embodiments, the second encapsulation may be customized by the customer to meet their environmental, quality, reliability, or security requirements. In some embodiments, the first encapsulant may be a molding compound, like a thermoplastic or thermosetting resin. In some embodiments, the second encapsulant may be a polymer/epoxy coating or glue, which is different from the first. In certain aspects, the second encapsulant may be selected to prevent removal or alteration of the functional module.

Figure 4D:
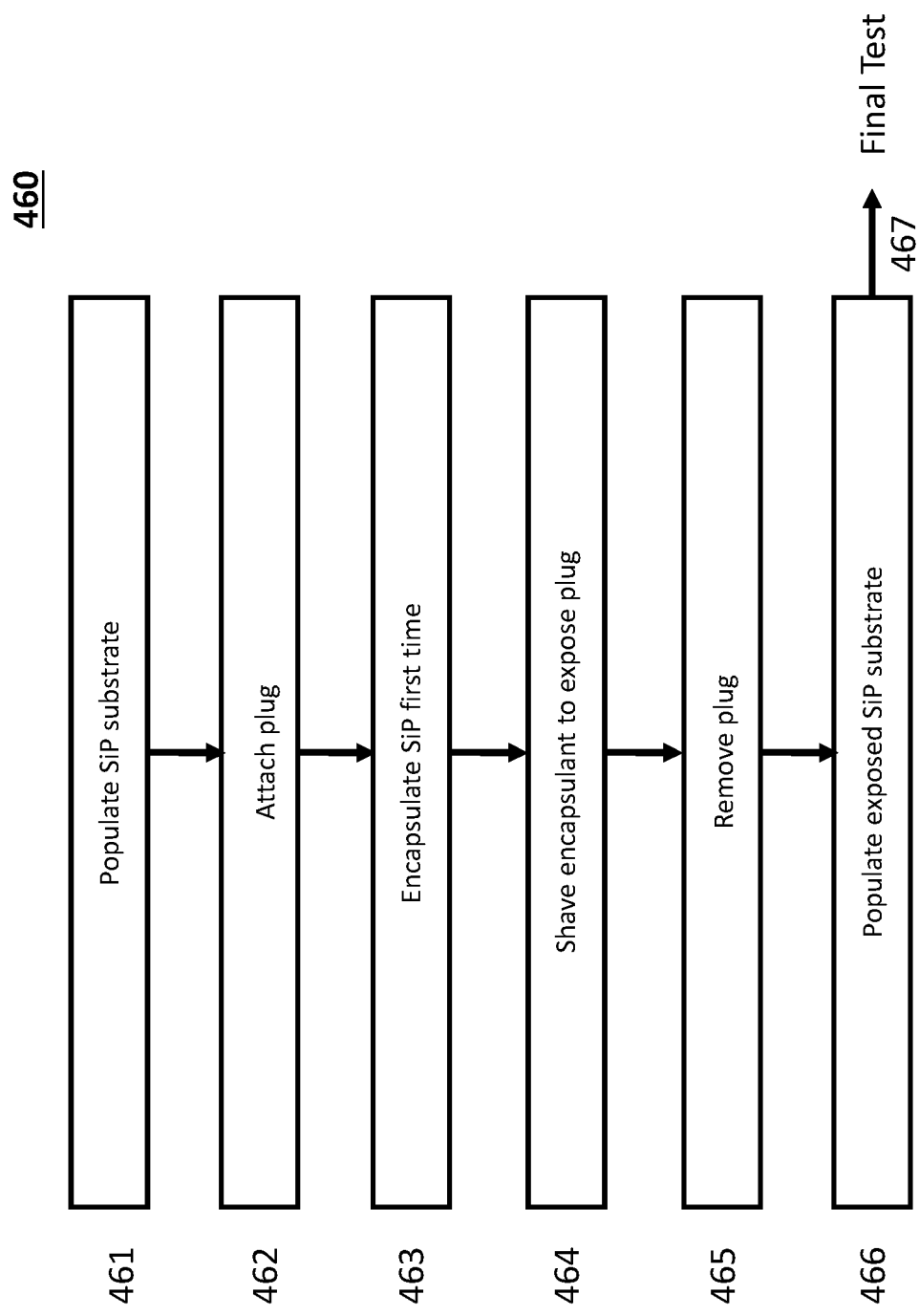

FIG. 4D depicts a variation of a process 460 that ends with an exposed area on the SiP, including secondary components. FIG. 4D may be, for instance, a method for adding exposed components on a SiP according to embodiments. In certain aspects, steps 461 through 466 are the same as steps 421-426. However, and according to embodiments, the second encapsulation may be skipped such that the secondary configuration components are left exposed. This method may be useful for attaching, for example, but not limited to, connectors, sensors, displays or switches to the SiP. Once completely assembled the SiP is tested 467 in some embodiments.

Figure 5:
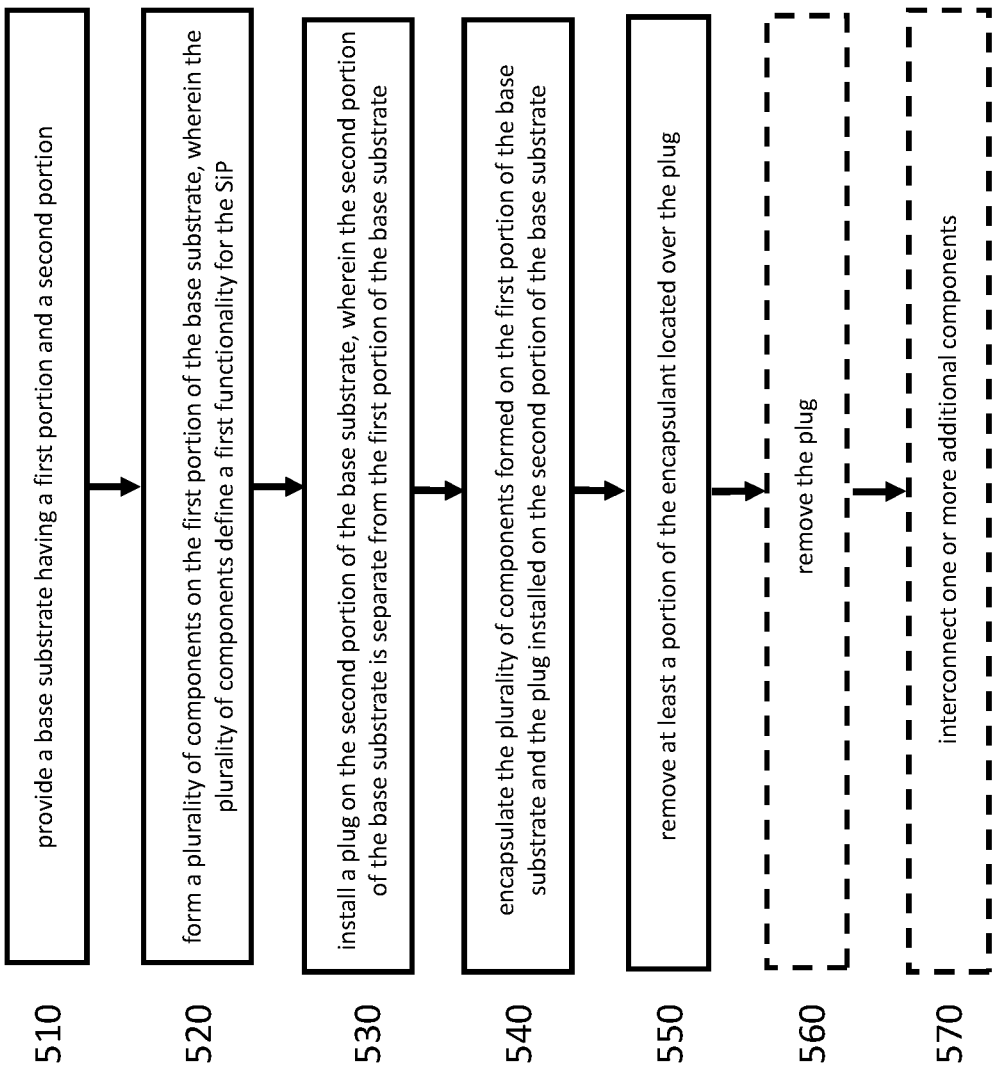
FIG. 5 depicts a process according to embodiments.

Referring now to FIG. 5, a process 500 is provided according to embodiments. The process 500 may be used, for instance, to manufacture a SiP as illustrated in connection with FIGS. 2 and 3, for instance.

The process may begin with step 510, in which a base substrate having a first portion and a second portion is provided. Providing the base substrate 510 could include, for instance, manufacturing, sending, receiving, or otherwise obtaining the base. In step 520, a plurality of components are formed on the first portion of the base substrate, where the plurality of components define a first functionality for the SiP. Forming 520 may include, for instance, mounting and/or interconnecting the components such that they perform a desired function. In step 530, a plug is installed on the second portion of the base substrate, where the second portion of the base substrate is separate from the first portion of the base substrate. In step 540, the plurality of components formed on the first portion of the base substrate and the plug installed on the second portion of the base substrate are encapsulated. In step 550, at least a portion of the encapsulant located over the plug is removed. For instance, it may be shaved away to expose the plug. In steps 560 and 570, which may be optional in some embodiments, the plug is removed and then one or more additional components are interconnected in the location of the plug. The additional components may be, for instance, a circuit, antenna, Ethernet connector, USB connector, or optical connector. The entire package may be encapsulated (e.g., with a second, different encapsulant), to form a fully packaged SiP (not depicted).

In some embodiments, the additional components change the first set of functionality to a second set of functionality, or add a second set of functionality to the first set of functionality. For example, the first set of functionality may comprise one or more of general purpose processing, transmit/receive functions, sensing functions, analog or digital or mixed signal functions, and optical processing/switching, while the second set of functionality is one or more of security, encryption, communications, sensing, transmission/receive functions.

In some embodiments, one or more additional components are interconnected with the base substrate in the second region before the plug is installed. According to embodiments, the plug is installed over the additional components.

While various embodiments of the present disclosure are described herein, it should be understood that they have been presented by way of example only, and not limitation. Thus, the breadth and scope of the present disclosure should not be limited by any of the herein above-described exemplary embodiments. Moreover, any combination of the herein above-described elements in all possible variations thereof is encompassed by the disclosure unless otherwise indicated herein or otherwise clearly contradicted by context. Accordingly, other embodiments, variations, and improvements not described herein are not excluded from the scope of the present disclosure. Such variations include but are not limited to new substrate material, different kinds of devices attached to the substrate not discussed, or new packaging concepts.

Additionally, while the processes described above and illustrated in the drawings are shown as a sequence of steps, this was done solely for the sake of illustration. Accordingly, it is contemplated that some steps may be added, some steps may be omitted, the order of the steps may be re-arranged, and some steps may be performed in parallel.

What is claimed is:

1. A method for manufacturing a System in a Package (SIP), the method comprising:
    attaching a first plurality of components to a first portion of a substrate, wherein the first plurality of components define a first functionality for the SiP;
    applying a plug to a second portion of the substrate, wherein the second portion of the substrate is different than the first portion of the substrate;
    encapsulating the first plurality of components and the plug with encapsulant; and
    removing the plug.

2. The method of claim 1, further comprising:
    removing at least a portion of the encapsulant that is located over the plug.

3. The method of claim 2, wherein removing a portion of the encapsulant located over the plug comprises shaving or grinding the encapsulant, or wherein the plug is comprised of a removable filler material, or wherein removing the plug comprises removing a portion of the encapsulant.

4. The method of claim 1, wherein the plug comprises a cap.

5. The method of claim 1, wherein at least one additional component is located on the second portion of the substrate, and wherein removing the plug exposes the at least one additional component.

6. The method of claim 5, further comprising:
    attaching one or more of the additional components to the substrate in the second portion before applying the plug.

7. The method of claim 5, wherein the additional component is a radio frequency (RF) connector.

8. The method of claim 1, further comprising:
    after removing the plug, attaching at least one additional component to the second portion of the substrate.

9. The method of claim 8, further comprising at least one of:
    re-encapsulating at least one component of the SiP, or
    re-encapsulating the entire substrate.

10. The method of claim 8, wherein the additional components change a first set of functionality to a second set of functionality of the SiP, or add a second set of functionality to the first set of functionality of the SiP.

11. The method of claim 10, wherein:
    the first set of functionality comprises one or more of general purpose processing, transmit/receive functions, sensing functions, analog or digital or mixed signal functions, or optical processing/switching; and
    the second set of functionality is one or more of security, encryption, communications, sensing, or transmission/receive functions.

12. The method of claim 8, wherein the additional component is a circuit, antenna, Ethernet connector, USB connector, or optical connector.

13. The method of claim 8, wherein the additional components are already mounted on a separate substrate before attaching.

14. The method of claim 1, further comprising:
    forming a plurality of surface connectors on the second portion of the substrate before installing the plug on the second portion of the substrate.

15. The method of claim 1, wherein attaching the first plurality of components to the first portion of the substrate comprises mechanically and electrically attaching the components to contact pads on a surface of the substrate.

16. The method of claim 1, wherein the substrate comprises a third portion and a connector element is mounted in the third portion.

17. A method for manufacturing a System in a Package (SIP), the method comprising:
    obtaining a SiP comprising a substrate and a removable plug,
        wherein a first plurality of components are attached to a first portion of the substrate,
        wherein the first plurality of components define a first functionality for the SiP,
        wherein the removable plug is provided over a second portion of the substrate,
        wherein the second portion of the substrate is different than the first portion of the substrate;
    removing the plug, and after removing the plug, attaching at least one additional component to the second portion of the substrate.

18. The method of claim 17, wherein the at least one additional component changes a first set of functionality to a second set of functionality of the SiP, or adds a second set of functionality to the first set of functionality of the SiP.

19. The method of claim 17, further comprising:
    after removing the plug, encapsulating at least one component of the SiP, or
    after removing the plug, encapsulating the entire substrate.

* * * * *